United States Patent [19]
Spangler et al.

[11] Patent Number: 5,343,064
[45] Date of Patent: Aug. 30, 1994

[54] FULLY INTEGRATED SINGLE-CRYSTAL SILICON-ON-INSULATOR PROCESS, SENSORS AND CIRCUITS

[76] Inventors: Leland J. Spangler, 1974 Traver Rd., Apt. No. 208; Kensall D. Wise, 3670 Charter Pl., both of Ann Arbor, Mich. 48105

[21] Appl. No.: 169,788

[22] Filed: Mar. 18, 1988

[51] Int. Cl.[5] .................... H01L 29/84; H01L 29/96; H01L 27/01
[52] U.S. Cl. .................... 257/350; 257/352; 257/418
[58] Field of Search ................ 357/26; 257/350, 352, 257/418

[56] References Cited

U.S. PATENT DOCUMENTS

| | | | |
|---|---|---|---|
| 3,397,278 | 8/1968 | Pomeranz . | |
| 3,595,719 | 7/1971 | Pomeranz . | |
| 3,721,588 | 3/1973 | Hays . | |
| 3,951,707 | 4/1976 | Kurtz et al. . | |
| 4,121,334 | 10/1978 | Wallis . | |
| 4,179,324 | 12/1979 | Kirkpatrick . | |
| 4,180,618 | 12/1979 | Alpha et al. . | |
| 4,285,714 | 8/1981 | Kirkpatrick . | |
| 4,426,768 | 1/1984 | Black et al. . | |
| 4,501,060 | 2/1985 | Frye et al. . | |
| 4,513,348 | 4/1985 | Grantham . | |
| 4,571,661 | 2/1986 | Hoshino | 357/26 |
| 4,582,559 | 4/1986 | Tanielian et al. . | |
| 4,701,424 | 10/1987 | Mikkor | 357/26 |
| 4,802,952 | 2/1989 | Kobori et al. | 357/26 |
| 4,815,472 | 3/1989 | Wise et al. . | |
| 4,819,037 | 4/1989 | Sakakibara et al. | 357/23.7 |
| 4,824,073 | 4/1989 | Zdeblick | 357/26 |
| 4,876,582 | 10/1989 | Janning | 357/23.7 |

OTHER PUBLICATIONS

R. C. Frye, et al., "A Field-Assisted Bonding Process for Silicon Dielectric Isolatiaon", J. Electrochemical Society, vol. 133, No. 8, pp. 1673-1677 (Aug. 1986).
M. Tanielian, et al., "A New Technique of Forming Thin Freestanding Single-Crystal Films", J. Electrochemical Society, vol. 132, No. 2, pp. 507-509 (Feb. 1985).
A. Brooks & R. Donovan, "Low-Temperature Electrostatic Silicon-To-Silicon Seals Using Sputtered Borosilicate Glass", Journal of Electrochemical Society, vol. 119, No. 4, pp. 545-546 (Apr. 1972).

(List continued on next page.)

Primary Examiner—Andrew J. James
Assistant Examiner—Ngan Van Ngo
Attorney, Agent, or Firm—Harness, Dickey & Pierce

[57] ABSTRACT

Integrated semiconductor-on-insulator (SOI) sensors and circuits which are electrostatically bonded to a support substrate, such as glass or an oxidized silicon wafer, are disclosed. The SOI sensors and SOI circuits are both formed using a novel fabrication process which allows multiple preformed and pretested integrated circuits on a silicon wafer to be electrostatically bonded to the support substrate without exposing the sensitive active regions of the electronic devices therein to a damaging electric field. The process includes forming a composite bonding structure on top of the integrated circuits prior to the bonding step. This composite structure includes a conductive layer dielectrically isolated from the circuit devices and electrically connected to the silicon wafer, which is spaced form but laterally overlaps at least the active semiconductive regions of the circuit devices. The SOI sensors each include a transducer and at least one active electronic device, which are both made at least in part from a common layer of lightly-doped single-crystal semiconductor material grown on the silicon wafer. After the bonding step, the bulk of the single-crystal wafer is removed, leaving the epitaxial layer containing the circuits and transducers. The epitaxial layer is then patterned into isolated mesas to dielectrically isolate the electronic devices. This patterning step also exposes bond pads, allowing external connections to be readily made to the sensors and circuits. Exemplary solid-state sensors disclosed herein include a capacitive accelerometer and pressure sensor.

8 Claims, 5 Drawing Sheets

OTHER PUBLICATIONS

G. Kuhn & C. Rhee, "Thin Silicon Film on Insulating Substrate", Journal of Electrochemical Society, vol. 120, No. 11, pp. 1563-1566 (Nov. 1973).

Y. Lee & K. Wise, "A Batch-Fabricated Silicon Capacitive Pressure Transducer with Low Temperature Sensitivity", IEEE Transactions on Electron Devices, vol. 1, No. 1, ED-29, pp. 420-428 (Jan. 1982).

L. Field & R. Muller, "Low-Temperature Silicon-Silicon Bonding with Oxides", Extended Abstracts of the Electrochemical Society, vol. 87-1, pp. 333-334 (Spring Meeting, Philadelphia, Pa., May 10-15, 1987).

B-Y. Tsaur, et al., "Merged CMOS/Bipolar Technologies Utilizing Zone-Melting-Recrystallized SOI Films", IEEE Electron Device Letters, vol. EDL-5, No. 11, pp. 461-463 (1984).

T. Sakai, et al., "Ion Sensitive FET with a Silicon-Insulator-Silicon Structure", Transducers '87, pp. 711-714 (1987).

K. Najafi, et al., "A High-Yield IC-Compatible Multichannel Recording Array", IEEE Transactions on Electron Device, vol. ED-32, No. 7, pp. 1206-1207 (Jul. 1985).

I. Choi, et al., "A Silicon-Thermopile-Based Infrared Sensing Array for Use in Automated Manufacturing", IEEE Transactions on Electron Devices, vol. ED-33, No. 1, pp. 72-79 (Jan. 1986).

T. Anthony, "Dielectric Isolation of Silicon by Anodic Bonding", J. of Applied Physics, vol. 58, No. 3, pp. 1240-1247 (Aug. 1985).

J. Lasky, "Wafer Bonding for Silicon-On-Insulator Technologies", Applied Physics Letters, vol. 48(1), pp. 79-80, (Jan. 6, 1986).

J-P. Colinge, "Properties of Thin-Film SOI MOSFETs", IEEE Circuits and Devices, pp. 16-20 (Nov. 1987).

E. Greeneich & R. Reuss, "Vertical n-p-n Bipolar Transistors Fabricated on Buried Oxide SOI", IEEE Electron Device Letters, vol. EDL-5, No. 3, pp. 91-93 (Mar. 1984).

J. Strum & J. Gibbons, "Vertical Bipolar Transistors in Laser Recrystallized Polysilicon", IEEE Electron Device Letters, vol. EDL-6, No. 8, pp. 400-402 (Aug. 1985).

A. Cuthberston & P. Ashburn, "Self-Aligned Transistors with Polysilicon Emitters for Bipolar VLSI", IEEE Transactions on Electron Device Letters, vol. ED-32, No. 2, pp. 242-247 (Feb. 1985).

H. W. Lam, et al., "Silicon-On-Insulator for VLSI and VHSIC", VLSI Electronics: Microstructure Science, vol. 4, Chapt. 1, (N. G. Einspruch Ed., Academic Press 3, 1982).

H. W. Lam, "Simox SOI for Integrated Circuit Fabrication", IEEE Circuits and Devices, pp. 6-11 (Jul. 1987).

B-Y. Tsaur, "Zone-Melting-Recrystallization Silicon-On-Insulator Technology", IEEE Circuits and Devices, pp. 12-16 (Jul. 1987).

P. Vasudev, "Recent Advances in Solid Phase Expitaxial Recrystallization SOS with Applications to CMOS and Bipolar Devices", IEEE Circuits and Devices, pp. 17-19 (Jul. 1987).

K. Krull, et al., "Electrical Radiation Characterization of Three SOI Material Technologies", IEEE Circuit and Devices, pp. 20-25 (Jul. 1987).

M. Haond et al., "Electrical Performances of Devices Made in SOI Films Obtained by Lamp ZMR", IEEE Circuits and Devices, pp. 27-30 (Jul. 1987).

J. Sturm & J. Gibbons, "A Three-Dimensional Merged Vertical Biopolar-MOS Device in Recrystallized Silicon", IEEE Transactions on Electron Devices, vol. ED-32, No. 11, p. 2548 (Nov. 1985).

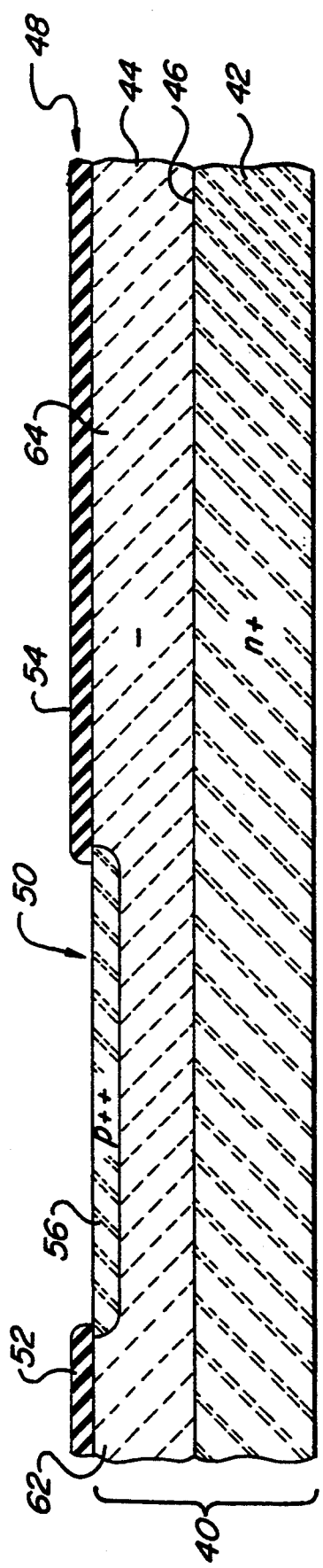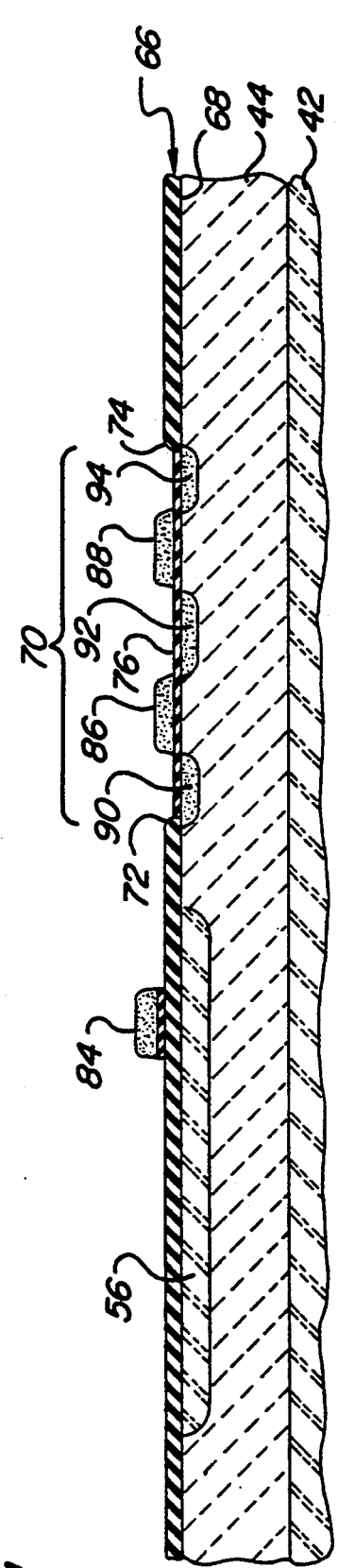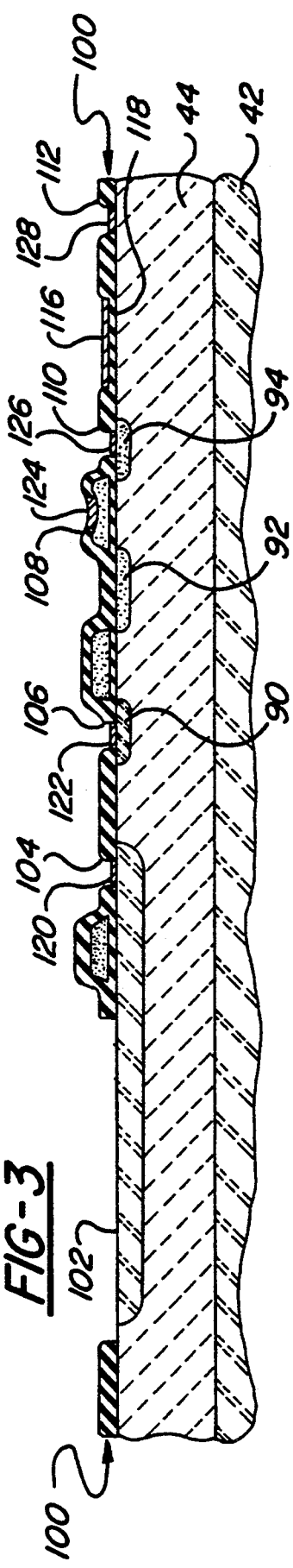

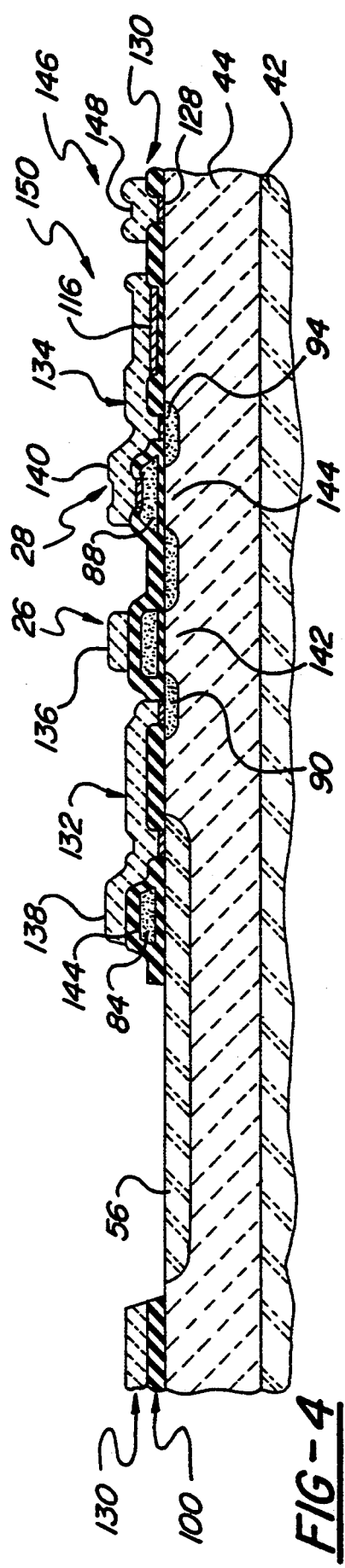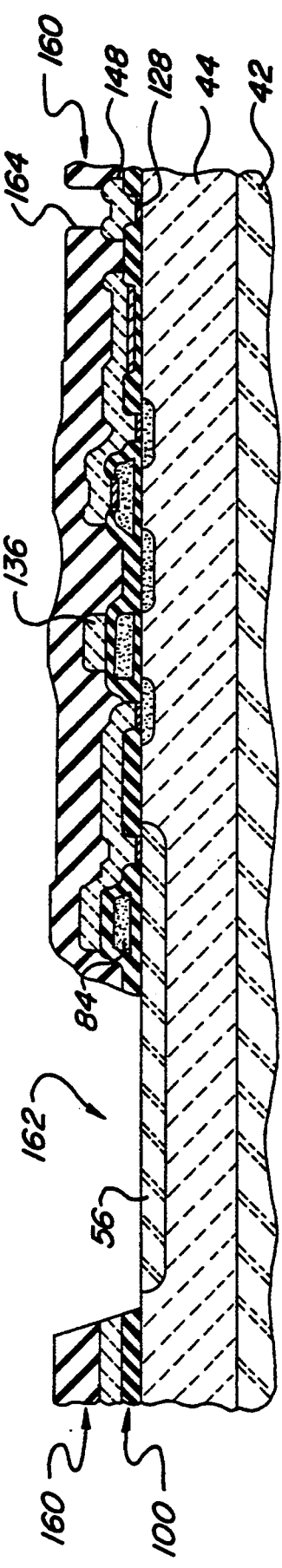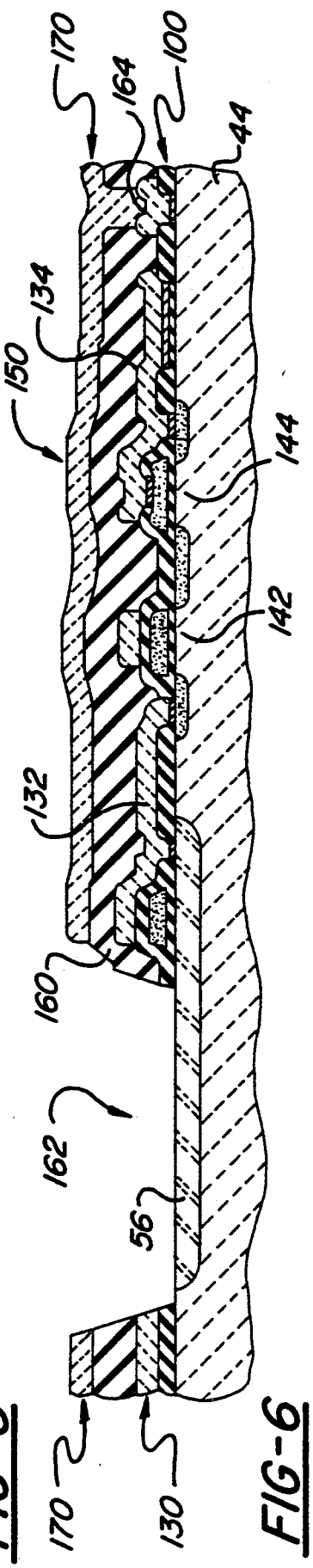

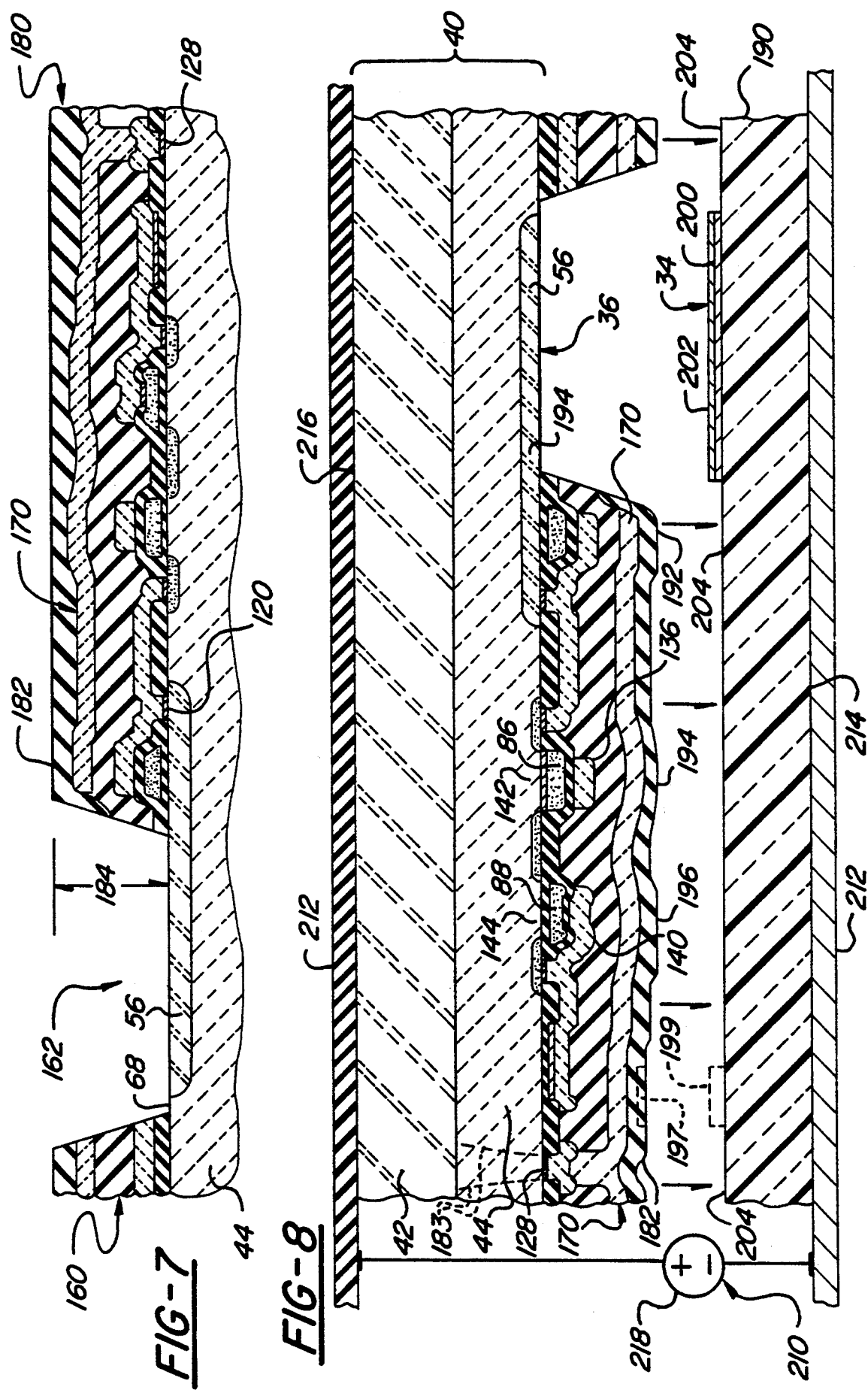

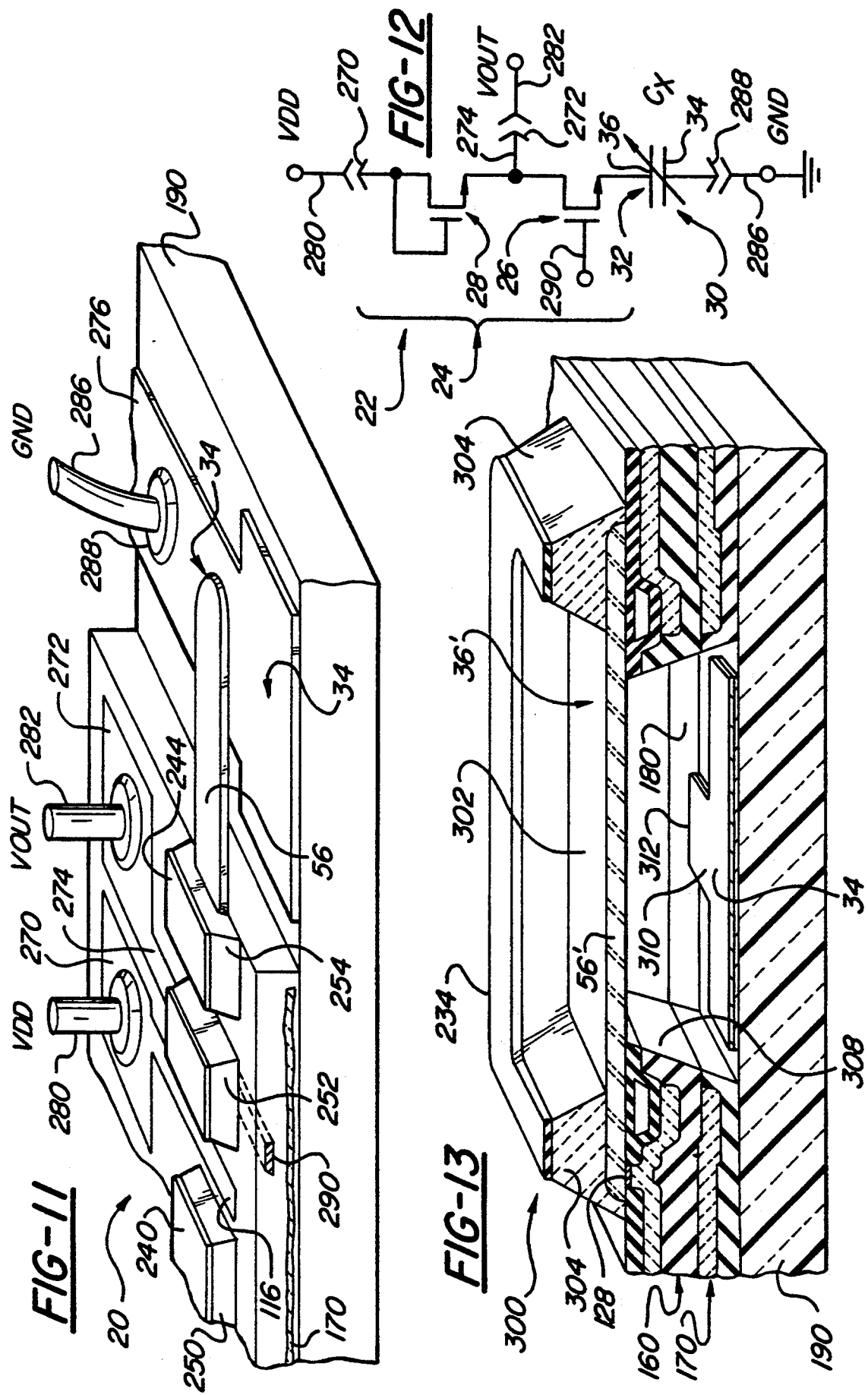

FULLY INTEGRATED SINGLE-CRYSTAL SILICON-ON-INSULATOR PROCESS, SENSORS AND CIRCUITS

FIELD OF THE INVENTION

The present invention relates in general to integrated semiconductor-on-insulator sensors and circuits, and the processes for forming same, and in particular to fully-integrated silicon-on-insulator (SOI) sensors and circuits, and processes using electrostatic bonding for forming the same on insulating support substrates, such as glass.

BACKGROUND OF THE INVENTION

Silicon-On-Insulator (SOI) technologies have advanced dramatically in recent years towards the goal of producing thin single-crystal silicon films on insulating substrates. See, for example, G. Possin et al., "MOSFET's Fabricated in Laser-Recrystallized Silicon on Quartz Using Selectively Absorbing Dielectric Layers," *IEEE Trans. Electron Devices*, Vol. ED-31, pp. 68–74 (1984); S. Malhi et al., "Characteristics of MOSFETs Fabricated in SPE Grown Polysilicon," *1985 Sympos. on VLSI Technol., Digest of Tech. Papers*, ; pp. 36–37 (Tokyo, 1985); Y. Kobayashi et al., "MOSFET Characteristics of Connected Silicon Islands on Fused Silica," *Extended Abs. 16th Conference on Solid-State Devices and Materials*, pp. 623–626 (Kobe, Japan, 1984). As suggested by the foregoing articles, the term "SOI" has been most commonly used in connection with metal oxide semiconductor field effect transistors (MOSFETs). As is discussed further below, existing SOI technologies suffer from material limitations in the quality of the crystalline material produced, such as grain boundaries, crystal defects, and doping constraints. Accordingly, transistors and other devices fabricated therefrom are inferior in many areas of performance to devices made using a conventional bulk silicon wafer process. Also, existing SOI technologies do not permit practical BJTs to be fabricated on glass, for reasons further discussed below.

Transistors fabricated in SOI films appear very attractive for a number of applications. The important feature in the SOI structure is the insulating substrate that reduces or eliminates certain parasitic device elements that are present in bulk silicon devices. These parasitic device elements include collector substrate capacitance and collector-substrate leakage current, which can both decrease circuit speed in bipolar devices. Parasitic device elements in CMOS monolithic silicon integrated circuits can also cause undesirable field conduction and a very undesirable phenomenon known as latch-up. In addition, there are many other parasitic capacitances and conductances in conventional monolithic silicon MOS circuits that decrease circuit speed. SOI transistors eliminate or reduce many of these parasitic device elements, allowing potentially faster integrated circuits to be fabricated in a smaller area.

SOI devices are also attractive as candidates for high voltage applications. In the design of these devices, the parasitic electrical elements and substrate connections in a bulk silicon integrated circuit become a limiting factor. The SOI device has no such parasitic elements because the substrate is an insulator. Thus, SOI technology will allow the fabrication of high voltage devices in a much smaller area, due to the reduced isolation area necessary, and they should be able to operate at higher voltages than devices made with bulk silicon technology.

In addition to the potential for reduced parasitic capacitance and leakage current, SOI devices have improved radiation hardness due to reduced junction area. SOI transistors on glass substrates are particularly attractive for sensors and displays, where high thermal, electrical, and physical isolation, an optically-transparent substrate, and compatibility with large areas are frequently important. For example, a high-performance transistor process for an active-matrix liquid-crystal display would allow the integration of the active pixel matrix with peripheral circuits on the same substrate, reducing electrical connections significantly, as discussed in A. Lakatos, "Promise and Challenge of Thin-film Silicon Approaches to Active Matrices," *1982 International IEEE Display Res. Conference*, pp. 146–151 (New York, 1982).

A wide variety of techniques have been proposed for realizing thin silicon films compatible with high-performance devices on an insulating substrate such as glass or oxidized silicon wafers. Crystallization of deposited polysilicon films using thermal energy derived from incident beams has met with some success. See, for example, R. Lemons et al., "Laser Crystallization of Si Films on Glass,", *Appl. Phys. Letters*, Vol. 40, pp. 469–471 (1982). However, performance of such devices employing recrystallized silicon is still limited by problems associated with silicon crystal quality. Moreover, these technologies are often limited in that the thickness of the SOI semiconductor layer which can be deposited on glass is on the order of one micron or less. Thus, those conventional bulk silicon devices requiring single-crystal layers thicker than about one micron often cannot be fabricated in SOI form. Device properties in polysilicon or in amorphous silicon films are generally still less favorable. Field-effect mobilities in unrecrystallized polysilicon transistors are limited to less than 50 $cm^2$/V-sec, while amorphous material usually produces channel mobilities on the order of 1 $cm^2$/V-sec. An interesting process for producing single-crystal silicon films on silicon dioxide on silicon has been presented recently in J. Lasky et al., "Silicon-on-Insulator (SOI) by Bonding and Etch-Back," *Digest 1985 IEEE Int. Electron Devices Mtg.;* pp. 684–687 (Dec. 1985). The reported process involves bonding two oxidized wafers together at high temperature and then thinning one wafer to produce a silicon-on-oxide film. However, this process does not yield the desirable properties of a glass substrate for sensor/display applications, and rather large voids during the bonding process are a concern. Work of a similar nature using electrostatically-produced bonds is reported in B. Anthony, "Dielectric Isolation of Silicon by Anodic Bonding," *Journal Of Applied Physics* (USA), Vol 58, No. 3, pp. 1240–1247 (Aug. 1985); R. Frye et al., "A Field-Assisted Bonding Process for Silicon Dielectric Isolation," *Journal of Electrochemical Society* (USA), Vol. 133, No. 8, pp. 1673–1677 (Aug. 1986).

Sensors have used glass substrates for many applications ranging from pressure transducers and micromachined chromatographs, where enclosed volumes are desired, to infrared imagers where thermal and/or electrical isolation of devices is required. Often these "glass substrate" sensors and utilize on-chip circuitry for signal processing, multiplexing and interfacing with other electronic circuits. With presently available technology, the circuits would have to be built into the silicon or attached to the glass substrate in a beam-lead, hybrid or flip chip technique. Such methods of interconnection generally require more area than if the circuit could be formed directly on the glass substrate, a goal which is highly desirable since it should reduce device size, increase the number of devices which could be processed at one time in a batch run, and increase reliability due to the need to make fewer "off-chip" interconnections. Improved performance and/or precision could also result.

Finally, current SOI techniques do not offer very good film uniformity or crystallinity over the area of an entire chip, let alone over an entire wafer. This greatly reduces yield and makes commercialization of SOI technologies economically impractical for all but the most exotic applications where normal cost considerations do not apply.

In an effort to overcome the foregoing problems, we have worked on new techniques for producing single-crystal thin semiconductor films on an insulating substrate, especially glass, which has electronic properties very similar to that bulk crystalline semiconductor films made of the same materials. In particular, we produced semiconductor-on-insulator structures suitable for subsequent fabrication of high-quality electronic devices thereon such as field effect transistors and bipolar junction transistors. Our earlier work involves electrostatic bonding of a silicon wafer, upon which is epitaxially grown a single-crystal film of any thickness, to an insulating substrate, such as glass, and the subsequent thinning of the bonded wafer to retain only the single-crystal film. An etch stop layer buried under the single-crystal film and doping-sensitive etchants are preferably used to accomplish the thinning of the wafer. A composite mobile ion barrier film, which includes a layer of silicon nitride and is bonded between the epitaxial layer and the glass, is used to prevent tramp alkali from the glass substrate from contaminating the silicon epitaxial layer. The resulting single-crystal SOI structure has been used to fabricate prototype NMOS transistors shown to have channel mobilities of 640 $cm^2/V$-sec, with leakage currents less than $10^{-14}$ amps/micron for w/l dimensions of 25 microns by 25 microns. We have also worked with bipolar junction transistors made from the aforementioned single-crystal SOI structure. The details of our earlier work is set forth in two commonly assigned, copending U.S. patent applications, the first of which is Ser. No. 027,717, ; filed Mar. 19, 1987, in the name of L. J. Spangler, and Ser. No. 156,854 filed Feb. 17, 1988, in the name of L. J. Spangler and K. D. Wise, the disclosures of which are hereby incorporated by reference.

In the course of our work disclosed in the aforementioned co-pending U.S. patent applications, we also wondered whether others had tried to bond fully-formed integrated circuits and solid-state devices to an insulating substrate using electrostatic bonding. Our searches revealed the following. U.S. Pat. No. 3,397,278 granted in 1968 to D. I. Pomerantz disclosed the electrostatic bonding of a semiconductor device or monolithic circuit to an insulator plate, such as quartz glass, borosilicate glass, or alumina. This patent also suggested bonding several silicon semiconductor devices to an insulating substrate such as glass while the devices still constitute a part of a single integral slice or wafer. U.S. Pat. No. 3,595,717 issued in 1971 to D. I. Pomerantz teaches the anodic bonding of an insulator member to an etched passivating layer covering a surface of a silicon semiconductor device containing p-n junctions. U.S. Pat. No. 4,121,334 to Wallis teaches the electrostatic bonding of a silicon wafer containing etched cavities and diffused integrated circuits thereon to a glass plate, such as Corning 7740 or 7070 glass, having a coefficient of thermal expansion comparable to that of monocrystalline silicon. However, the silicon wafer is not thinned, and the integrated circuits are diffused on a side of the wafer opposite from the side bonded to the glass substrate.

U.S. Pat. No. 4,426,768 to J. Black et al. teaches the fabrication of a plurality of ultra-thin microminiature pressure sensors by joining two silicon wafers by electrostatic bonding. Prior to bonding, the first wafer is processed to form a plurality of resistor arrays coated with a layer of phosphosilicate glass to protect p-n junctions therebelow from contamination by mobile sodium ions in or on the borosilicate glass that is deposited subsequently in later processing steps. A first layer of aluminum is then deposited between these two glass layers, and appears everywhere in the first wafer except in the regions near the resistor arrays. A second layer of aluminum is provided on the back of the second wafer. The first and second aluminum layers are then connected to a 40 to 50 volt DC supply to electrostatically bond the borosilicate glass on the first layer to the undoped silicon layer of the second wafer. After this bonding step, the composite wafer is then processed to form individual pressure sensors. This patent, however, does not mention Forming active electronic devices or circuits on either the first or second wafers. Instead, the transducers are wire-bonded to external circuits.

In our experiments, we found that the electrostatic bonding of integrated circuitry on a silicon wafer to an insulating substrate wrecks havoc with the active regions of the active electronic devices, such as transistors, of the circuitry. For example, the interface between the single-crystal channel region and insulated gate of a field effect transistor is often unpredictably altered, changing the threshold voltage $V_T$ of the device and rendering device performance unsatisfactory. We suspect that others may have also observed this destructive effect that electrostatic bonding has upon integrated circuits, which would help explain why, out of all the recent articles we have seen concerning ongoing efforts to develop an economical and commercially viable SOI technology, none discuss the electrostatic bonding of pre-formed transistor devices and circuits to an insulating substrate as a technique for forming SOI semiconductor devices. Our efforts to overcome such problems lead to the present invention.

A basic object of the present invention is to overcome the foregoing fundamental problems associated with electrostatically bonding fully-formed integrated circuits and electronic devices to an insulating substrate. Another object of the present invention is to produce a semiconductor-on-insulator circuit structure using pre-formed and pre-tested conventional integrated circuitry from a single-crystal silicon wafer. Another object of the present invention is to from a fully-integrated sensor using at least one pre-formed solid-state electronic device on a single-crystal wafer which has an active region of single-crystal semiconductor material and at least a pre-formed portion of a transducer on the same single-crystal wafer, which is electrostatically bonded to an insulating substrate such as glass.

Yet another object of the present invention is to provide a method of making fully integrated SOI sensors, including at least one transducer and an integrated electronic circuit on glass. Still another object is to provide a technique or mechanism to ensure that active semiconductor devices in a fully-formed microelectronic circuit are not damaged when electrostatically bonded at high voltages to a supporting substrate. One more object of the present invention is to provide an efficient manner of processing SOI devices which utilizes a single processing step to perform two or three important functions, including dielectrically isolating electronic devices and exposing previously prepared bond pads.

SUMMARY OF THE INVENTION

In light of the foregoing problems and to realize the foregoing objects, we have created the present invention, which has seven independently claimed aspects. In accordance with a first aspect of the present invention, there is provided a microelectronic structure having a plurality of electronic devices, comprising: a solid state circuit structure, a support substrate, and an insulating means disposed permanently and rigidly between the circuit structure and the support structure. The insulating means is permanently joined to the circuit structure and electrostatically bonded to the support structure. The circuit structure has at least two distinct electronic devices electrically interconnected to one another, with each of the devices having at least one active region of single-crystal semiconductor material formed from a common layer of epitaxially-grown, single-crystal semiconductor material. The insulating means includes therein means which enable the insulating means while permanently joined to the circuit structure to be electrostatically bonded to the support substrate without subjecting the active regions of the devices to damage due to the applied electric field. The insulating means preferably includes first and second layers of insulating material and a first layer of conductive material located between the first and second layers of insulating material. One of the layers of insulating materials includes at least one opening therein for enabling direct electrical contact to be made between the first layer of conductive material and the common layer of epitaxially-grown single-crystal semiconductor material, so that an electric field can be applied principally across at least the second layer of insulating material during the bonding step, rather than across the active regions of the electronic devices.

According to a second aspect of the invention, there is provided a method of fabricating integrated semiconductor-on-insulator microelectronic circuit structures. The method comprises the steps of: (a) providing a single-crystal silicon substrate having a solid-state circuit structure formed on one side thereof, the circuit structure including a plurality of substantially fully-formed electronic devices electrically interconnected to one another, with each of the devices including at least one active region of single-crystal semiconductor material; (b) providing a support substrate substantially thicker than the solid-state circuit structure; (c) permanently forming adjacent to the circuit structure bonding means for enabling the circuit structure to be electrostatically bonded to the support substrate without subjecting the active regions of the devices to a damaging electrostatic field; and (d) electrostatically bonding the circuit structure and support substrate together by bringing the bonding means and support substrate in physical contact with one another and then applying an electric field which extends across the single-crystal substrate including the circuit structure and bonding means thereon and at least part of the support substrate. The method preferably further comprises the steps of: (e) forming as part of the bonding means, at least one layer of conductive material dielectrically insulated from one side of the circuit structure and electrically connected with the single-crystal substrate; (f) providing as part of step (d) electrostatic bonding equipment including first and second electrodes, with the first electrode being positive charged and placed in direct electrical contact with the single-crystal substrate, and the second electrode being negatively charged and placed in direct electrical contact with the support substrate; and (g) as part of step (d), establishing for at least a predetermined minimum amount of time an electric potential between the first and second electrodes of at least several tens of volts.

According to a third aspect of the present invention, there is provided an integrated solid-state sensor comprising: a solid-state transducer structure; a first solid-state electronic device; a support substrate; and insulating means disposed permanently and rigidly between the electronic device and support substrate. The transducer structure has at least one electronically detectable characteristic which varies in response to variations in a physical condition present in the local environment of the transducer. Also, the structure is made at least in part from a first layer of single-crystal semiconductor material. The first electronic device has at least one active region thereof formed at least in part of the first layer of single-crystal semiconductor material. The device also has first means for electrically interconnecting the device to the transducer structure and second means for producing an electrical signal which varies in response to the electronically detectable characteristic of the transducer structure. The insulating means is electrostatically bonded to the support substrate and includes therein means which enable the insulating means while permanently joined to the electronic device to be electrostatically bonded to the support substrate without subjecting the active region of the device to a damaging electric field.

According to a fourth aspect of the present invention, there is provided a method of making a fully integrated sensor comprising the steps of: (a) providing a crystalline substrate having at least a first layer of epitaxially-grown, single-crystal silicon semiconductor material on side thereof; (b) forming at least partly within the first layer at least one transistor including at least one active region of single-crystal semiconductor material; (c) forming at least partly within the first layer a transducer structure having at least one electronically detectable characteristic which varies in response to variations in a selected physical condition present in the local environment of the transducer structure; (d) providing a support substrate; (e) electrically interconnecting the transducer structure to the transistor; (f) thereafter forming electric field control means for selectively directing an applied electric field away from at least the active region of the transistor, by depositing at least a first layer of conductive material over at least part of the transistor; and (g) electrostatically bonding the crystalline substrate to the support substrate so that the field control means is disposed therebetween.

According to a fifth aspect of the present invention, there is provided a method of electrostatically bonding a substantially fully-formed solid-state electronic device to a support substrate without subjecting the device to a damaging electric field during the bonding step. The method comprises the steps of: (a) providing a single-crystal substrate having at least one substantially fully-formed solid-state electronic device, the device including at least one active region of single-crystal silicon semiconductor material; (b) forming over the substrate and the electronic device a first layer of insulating material; (c) forming a first layer of conductive material over the first layer of insulating material, with the layer of conductive material being disposed in overlapping relationship relative to the active region of the electronic device; (d) forming a second layer of insulating material over the first layer of conductive material so that the first layer of conductive material is generally covered thereby; (e) providing a support substrate having at least one layer of electrically insulative material on one side thereof; and (f) electrostatically bonding the support substrate and the single-crystal substrate by establishing an electric field which extends between at least the single-crystal substrate, the first layer of conductive material and the layer of insulative material of the support substrate.

According to a sixth aspect of the present invention, there is provided a method of fabricating at least one silicon-on-insulator electronic device having an active region of single-crystal semiconductor material and formed on a support substrate which performs two distinct functions simultaneously, thereby helping to reduce manufacturing costs and improve yield. The method comprises the steps of: (a) providing a bulk single-crystal substrate having a first layer of lightly-doped single-crystal silicon semiconductor material on one side thereof; (b)forming at least one solid-state electronic structure on the first layer of semiconductor material, the structure including at least one active region of single-crystal silicon semiconductor material, at least one electrode region electrically connected to the active region, a layer of patterned conductive material formed over part of the first layer and spaced laterally away from the active region for use as at least part of a bonding pad, and a first layer of patterned conductive interconnect material extending laterally between and in electrical contact with the layer of patterned pad material and the one electrode region; (c) providing a layer of insulating material which overlies a substantial portion of the electronic structure including the layer of patterned pad material and the interconnect material; (d) bonding the single-crystal substrate to a support substrate so that the electronic structure is disposed between the single-crystal substrate and the support substrate; (e) removing the single-crystal substrate down to the first layer of single-crystal semiconductor material so that a substantially planar portion of the first layer remains and has an exposed surface; and (f) selectively removing at least the first part of the remaining portion of the First layer located between the exposed surface thereof and the layer of patterned pad material to expose at least part of the pad material for use as a bond pad. The method preferably also comprises the step of (g) simultaneously with step (e) selectively removing at least a second part of the remaining portion of the first layer to form at least a mesa of single-crystal semiconductor material which includes the active region of the electronic structure.

According to a seventh aspect of the present invention, there is provided a solid-state capacitive accelerometer including at least one active electronic device integrally formed therewith and connected thereto. The accelerometer comprises: a support substrate having at least a first layer of insulating material on one side thereof; a substantially planar layer of conductive material formed on side of the support substrate; a substantially planar semi-flexible conductive member of heavily-doped silicon semiconductor material formed From a first layer of single-crystal silicon semiconductor material extending substantially parallel to and spaced apart from the planar layer of conductive material, such that the planar layer of conductive material and semi-flexible conductive member Form first and second plates of an adjustable capacitor. The semi-flexible member is unsupported at one end thereof, which allows the capacitance of the capacitor to readily vary as a function of force applied to the semi-flexible member, such as by acceleration. The accelerometer includes at least one solid-state electronic device. The device includes at least one active region of single-crystal semiconductor material formed from the first layer of single-crystal semiconductor material. It also includes at least one electrode electrically connected to the active region and a layer of patterned conductive interconnect material extending between and in electrical contact with the electrode and the semi-rigid member. Finally, the accelerometer includes spacer means disposed between the electrical device and the support substrate for providing a clearance between the semi-flexible member and planar layer of conductive material on the support substrate. The spacer means has at least one opening therein between the semi-flexible member and the planar layer of conductive material forming the adjustable capacitance.

These and other objects, advantages, and aspects of the present invention may be further understood by referring to the detailed description, accompanying figures, and appended claims.

BRIEF DESCRIPTION OF THE DRAWINGS

The drawings form an integral part of the detailed description and are to be read in conjunction therewith. For ease of illustration and to render the described embodiments more readily understandable, the various layers and features in the Figures are not shown to scale. Identical reference numerals designate like layers or features in the different Figures. FIGS. 1 through 10 show, in similar fragmentary side views taken in cross-section, successive stages of the construction of an exemplary fully-integrated SOI sensor, namely a capacitive accelerometer, wherein:

FIG. 1 shows a single-crystal silicon semiconductor wafer including a lightly-doped epitaxial layer grown thereon that has a heavily-doped region formed through a via in an oxide layer;

FIG. 2 illustrates the FIG. 1 structure after further processing steps which have added three moderately doped regions, new layer of oxide, and three conductive mesas;

FIG. 3 shows the FIG. 2 structure after a passivating layer has been formed over the three conductive mesas to complete two field effect transistors (FETs), and after five conductive metallized areas have been formed;

FIG. 4 shows the FIG. 3 structure after a first patterned conductive layer has been deposited for interconnect purposes to form an integrated circuit;

FIG. 5 shows the FIG. 4 structure with a relatively thick first insulating spacer layer over the circuit portion of the FIG. 4 structure;

FIG. 6 shows the FIG. 5 structure with a patterned conductive electric field control layer deposited on top of the first insulating spacer layer, and in electrical contact with an epi layer contact pad;

FIG. 7 shows the FIG. 6 structure with a second patterned insulating spacer layer formed over the field control layer;

FIG. 8 is a composite view showing the FIG. 7 structure turned upside-down in order to allow it to be placed on top of a glass substrate and electrostatically bonded thereto;

FIG. 9 shows the bonded glass and silicon wafer structure after the FIG. 8 bonding step, with all of the silicon wafer, except the epitaxial layer, removed therefrom, and with an insulating layer and patterned mass of metal formed on the epitaxial layer that remains; and FIG. 10 shows the FIG. 9 structure after an etching step where the epitaxial layer is patterned into islands, the heavily doped region is freed at one end thereof in order to serve as a cantilevered beam, and the bond pads are exposed, which substantially completes the capacitive accelerometer.

FIG. 11 is a simplified fragmentary perspective view of the FIG. 10 accelerometer showing the cantilevered beam, several single-crystal islands, and three external leads connected to bond pads.

FIG. 12 is a schematic diagram depicting the electrical devices and wire interconnections of the integrated sensor shown in FIGS. 10 and 11 as conventional circuit symbols.

FIG. 13 is a fragmentary side cross-sectional perspective view of a capacitive pressure sensor made in the same manner as the FIG. 10 accelerometer except that the heavily-doped region is supported on all sides and forms a semi-flexible roof for the hermetically-sealed chamber of the pressure sensor.

DETAILED DESCRIPTION OF THE PREFERRED EMBODIMENTS

Figure 9:
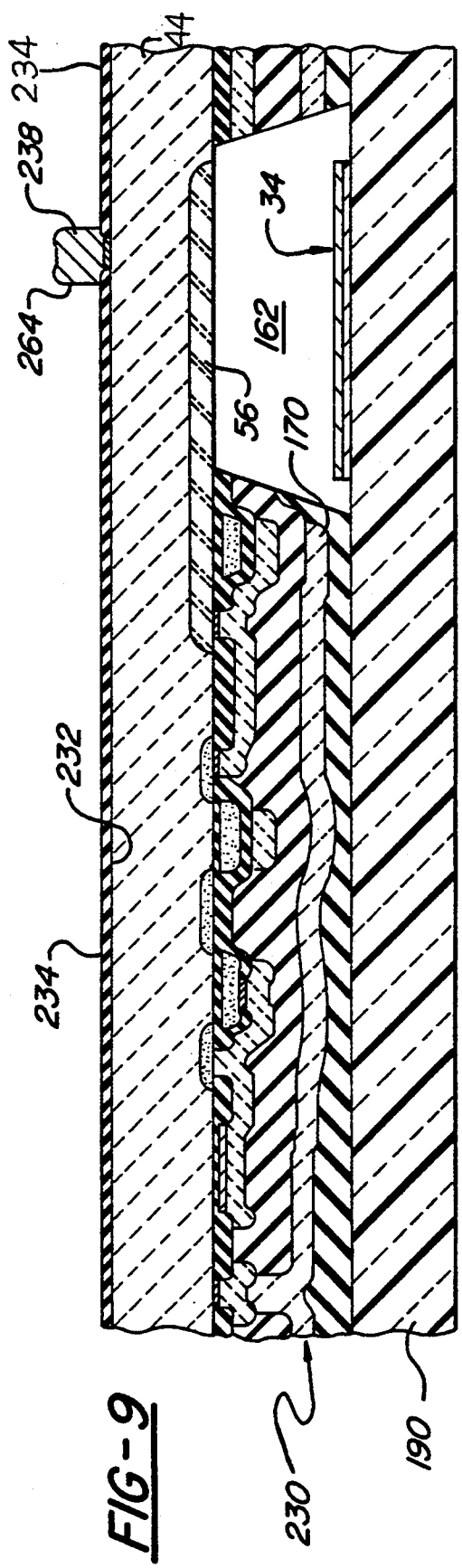

The various aspects of the present invention will all be conveniently explained principally through the description of the construction of a single, fully-integrated solid-state, semiconductor-on-insulator (SOI) sensor, namely a cantileverbeam capacitive accelerometer illustrated in FIGS. 1–12. The various stages of construction of this accelerometer are illustrated in FIGS. 1–10, and the completed accelerometer 20 is shown in cross-section from a side view in FIG. 10 and from a perspective view in FIG. 11. FIG. 12 shows a schematic diagram 22 of the accelerometer 20, which shows by way of conventional circuit symbols that the accelerometer includes a solid-state circuit structure 24 having two electrically-interconnected field effect transistors 26 and 28 and a solid-state transducer structure 30 including a parallel-plate capacitor formed of plates 34 and 36. The plate 34 is a stationary conductive metal pad while the plate 36 is a semi-flexible beam member formed of heavily-doped single-crystal semiconductor material as will be further explained. The present invention resides, not in the electrical circuit configuration illustrated in FIG. 12, which is conventional, but in the manner in which the capacitive accelerometer 20, and in particular its SOI circuit structure 24, is constructed. The particular physical structure and process steps used to form the accelerometer 20 and circuit structure 24 are most easily understood by examining the various stages of construction and processing, as will now be explained with respect to FIGS. 1–11.

Referring now to FIG. 1, there is shown a single-crystal silicon semiconductor wafer 40 having a heavily-doped support layer 42 and an epitaxially-grown single-crystal layer 44. This wafer 40 is preferably a conductive, fairly heavily-doped ($10^{18}$ cm$^{-3}$ or more-)<100> silicon semiconductor wafer of the type now commonly used to fabricate high-performance, latch-up resistant silicon CMOS circuitry. To provide a sharper, well-defined boundary between the bulk region 42 and epi layer 44 of the wafer 40, it is preferred to use antimony or arsenic as the n-type dopant in the bulk region 42. Such dopants are slow to diffuse in the face of prolonged, high-temperature processing steps performed subsequently to fabricate the circuitry of accelerometer 20. The single-crystal film 44 is epitaxially grown above the conventionally polished surface 46 of wafer 40 to a desired thickness, such as 6 to 10 microns or greater. The epi layer 44 is doped with boron to a desired concentration, such as $5 \times 10^{15}$ to $10^{17}$ atoms cm$^{-3}$. Higher doping levels are typically employed when smaller device and feature sizes are used. Any suitable thickness and doping level for the epi layer 44 may be employed, however, and may well vary with the type of circuit devices to be fabricated.

The single-crystal semiconductor film 44 is then thermally oxidized in a steam ambient to an appropriate thickness to act as a masking oxide 48. This oxide is then conventionally patterned using buffered hydrochloric acid to provide the opening 50 between left and right portions 52 and 54 of the oxide layer 48. Boron is then diffused into the epitaxial layer 44 through opening 50 to form a very heavily-doped ($5 \times 10^{19}$ cm$^{-3}$ or more) p++ planar region 56, which will later become the semi-flexible member 36 of the parallel plate capacitor 32. The oxide layer 48 only need be thick enough to serve as a mask to prevent boron from diffusing into the epitaxial layer 44 such as regions 62 and 64 thereunder. The size and thickness of the heavily-doped region 56 is dependent upon the particular stress/strain requirements and specifications for the semi-flexible member 36, as will be further explained later. Oxide layer 48 is then stripped off.

The next several process steps will be recognized by those in the art as standard IC fabrication techniques. Equivalent processes, such as the LOCOS process, may be used in place of the standard steps which will now be described with respect to FIGS. 2 through 4. As shown in FIG. 2, a new field oxide layer 66, preferably 300 to 1000 nanometers or thick, is thermally grown upon the surface 68 of the epi layer 44. Oxide layer 66 is then conventionally patterned using buffered hydrofluoric acid to form a single large opening in the area 70 extending from left edge 72 to right edge 74 of the opening in layer 66. Next, a gate oxide layer 76 is thermally grown to a thickness of 10 to 100 nanometers or more, preferably about 50–70 nanometers thick. A layer of polysilicon 300 to 1000 nanometers or more thick is deposited, and patterned in a CF$_4$—O$_2$ plasma to form mesas 84, 86 and 88. The mesas 86 and 88 will serve as polysilicon gates for field-effect transistors 26 and 28. Phosphorous is then ion-implanted at a suitable energy level and dose, such as 100 KeV and $5 \times 10^{15}$ atoms cm$^{-2}$, to form the n-type regions 90, 92 and 94 and to dope the polysilicon gates 86 and 88. The implant is then annealed to activate the ion-implanted dopants.

As indicated in FIG. 3, the structure of FIG. 2 is then subjected to a steam oxidation which forms all or part of a first interdielectric layer 100. If desired, the thickness of insulating layer 100 can be increased through chemical vapor deposition (CVD) of silicon oxide, silicon nitride or borophosphosilicate glass (BPSG). The oxide portion of layer 100 can be obtained without additional process steps since the polysilicon gates must be doped and annealed, and it is a simple matter to add oxygen to the nitrogen atmosphere during this annealing step. There are several benefits to adding a CVD insulator on top of the thermal oxide as part of the insulator layer 100. First, the insulator layer 100 can be made to any desired thickness. Second, the CVD portion of the insulating layer may serve as a mobile ion barrier to protect against contaminants such as mobile sodium ions which could otherwise damage the desired properties of the transistors 26 and 28. In this regard, silicon nitride is an especially effective mobile ion barrier. Third, the conformal properties of such a CVD layer provide a planarizing function which helps reduce step coverage problems in the deposition of subsequent layers. BPSG in particular has good reflow properties, and thereby helps reduce the sharpness of step coverage. Layer 100 is then patterned as shown using conventional photolithographic techniques.

Before the photoresist used to pattern the layer 100 is removed, the source and drain regions 90, 92 and 94 are impregnated with a refractory material such as platinum to form platinum silicide. This is useful for two reasons: it lowers the resistance of the electrical contact to the source and drain regions, and it allows a contact or bond pad 116 to be formed. The layer of insulator 118 shown beneath the pad 116 is not necessary if the etchant subsequently used to etch away the bulk portion of the epi layer 44 (as will be later be discussed) does not attack the bond pad metal. However, if the metal of bond pad 116 is susceptible to attack during the etching of the epi layer, an insulating layer 118 should be used to avoid such attack. This insulating layer may be silicon oxide, for example.

After removal of the photoresist used to pattern insulating layer 100, a layer 130 of interconnect material is deposited and patterned as shown in FIG. 4. Layer 130 may be of any suitable thickness, such as 100 to 1000 nm or more. This interconnect layer 130 may be made of a high-temperature refractory material such as tantalum or platinum, doped polysilicon or a refractory metal silicide. Doped amorphous silicon may also be used, since subsequent high-temperature processing steps above 600 degree C. will cause the amorphous silicon to turn to polysilicon. Aluminum cannot be used for layer 130 since aluminum can only withstand 450 degrees C. for a short period without forming an electrically degrading eutectic with silicon. Even the electrostatic bonding process which will be subsequently described with respect to FIG. 8 is typically employs temperatures around 450 degrees C. or higher. Thus, we strongly prefer that the layer 130 should be comprised of a high-temperature metal silicide that can maintain ohmic contact with silicon even when it undergoes further high-temperature processing. Silicides made from tantalum, molybdenum, tungsten and platinum may be used for layer 130, the processing of which is described in S.P. Murarka, *Silicides For VLSI Applications*, Academic Press, New York (1983).

The interconnect portion 132 of layer 130 electrically connects the doped cantilever beam region 56 to the source region 90 of transistor 26. Interconnect portion 134 electrically interconnects the gate 88 and drain region 94 of the transistor 28 to the bond pad 116. Portion 136 of layer 130, and sections 138 of interconnect portion 132 and section 140 of interconnect portion 134, also perform an important mechanical function, in that they help ensure that the epitaxial layer 44 is not subsequently subjected to unnecessary deflection or mechanical stress as a result of the electrostatic bonding step. This is accomplished by having the epitaxial layer 44 supported at a sufficient number of contact points, and by locating those contact points directly above the active regions of the solid-state devices, such as the channel regions 142 and 144 of transistors 26 and 28 respectively. It will be noted that sections 136 and 140, along with section 138, are the high points on the overall structure 146 shown in FIG. 4. The polysilicon region 84 and the insulator section 144 beneath high section 138 are also provided solely to ensure that section 138 is indeed the high point in its area, which helps and properly support the cantilever beam region 56, as will become more evident from the description below. The function of interconnect portion 148 electrically connected to contact 128 is to enlarge the size of contact 128, and make it easier to make contact with it in subsequent steps.

The structure 146 shown in FIG. 4, including the completed microelectronic circuit 150 and the doped region 56, shown in FIG. 4, has been fabricated as described above using standard VLSI fabrication techniques and materials. As those skilled in the art will readily appreciate, several dozens to several thousands or more of such circuits 150 may be fabricated on a single wafer 40 three inches or greater in diameter. The circuits 150 on a common wafer may be electronically tested using well-known automated VLSI wafer testing equipment and procedures to verify its functionality of individual circuits 150, and to pinpoint the location of any non-working circuit on the wafer. Later, when the fully processed wafer is diced into individual integrated sensors 20, the sensors which have a non-working circuit 150 may be discarded, while the sensors 20 having circuits 150 which are functioning properly will be saved for assembly into suitable integrated circuit (IC) chip packages.

After functionality testing, the microelectronic circuits 150 of wafer 40 are then coated with a relatively thick (1 to 10 or more microns) composite layer of insulating material deposited by chemical vapor deposition, as shown in FIG. 5. This layer 160 is sometimes called the second interdielectric layer, and it is conventionally patterned and etched to provide an open area 162 adjacent the beam 56 and to allow electrical contact at location 164 above pads 128 and 146 by a subsequent conductive layer 170. Layer 160 may consist of several materials laminated together, if desired. For example, a layer of silicon nitride or silicon dioxide may be first deposited over the entire circuit 150. This encapsulates the circuit 150 and acts as a diffusion barrier for potential impurities. Silicon nitride is preferred for this purpose due to its greater ability to prevent migration of mobile ions, such as sodium. The thickness of the diffusion barrier should be at least 50 nanometers and is preferably 200 to 500 nanometers or more thick. Siliconoxynitride may also be used as the diffusion barrier; however, as the purity of the silicon nitride therein is decreased by increasing oxygen concentration, the ability to block mobile ions is correspondingly reduced.

Other glasses containing silicon which form a barrier to mobile ions, such as silicate glasses including borosilicate glass and BPSG may also be used for the diffusion barrier. BPSG is preferred in that it helps the most to planarize the layer 160. The various individual layers within composite layer 160 may be selected in thickness so that the composite layer has a coefficient of thermal expansion fairly closely matched to that of the silicon epi layer 44. One possible combination is $SiO_2$, $Si_3N_4$ and $SiO_2$ arranged to have a ratio of thickness of 1:2:1.

FIG. 6 shows a layer 170 of conductive material deposited on top of the layer 160 and patterned so as to not intrude upon open area 162. Layer 160 is preferably kept fairly thick so as to minimize parasitic capacitances between layer 170 and the electronic devices of circuit 150. The conductive layer 170 makes electrical contact with metal pad 148 through opening 164. The layer 170 may be made from any of the materials from which interconnect layer 130 is made, and may be 100 to 1000 nm or more thick. Conductive layer 170 acts as an electric field control layer which helps protect the integrated circuit 160 from adverse or damaging electrical fields during the subsequent electrostatic bonding step. During electrostatic bonding, the layer 170 is held at about the same electric potential as the silicon wafer 40 on account of the electrical connection made through contact 128 and numerous other contacts like contact 128, strategically placed about the wafer and which contact the epi layer 44. By providing one or more conductive paths through which the very small electrical currents required for electrostatic bonding can flow which are preferably spaced laterally quite some distance, i.e., several microns or tens of microns, away from the sensitive active regions of transistors 126 and 128, the layer 170 controls and reduces the electrical field experienced by the active regions of electronic devices of circuit 150 to a harmless level. It is the Si—$SiO_2$ interfaces of the channel regions 142 and 144 which are most susceptible to harm in FETs 126 and 128. Accordingly, the contact points, such as a pad 128, between the epi layer 44 and the layer 170, are preferably located at a maximum distance from such active regions of the FETs. Although the lightly-doped epi region is only mildly conductive and cannot support much current at room temperature, the degree of conductivity increases greatly at the elevated bonding temperatures due to the thermal excitation of charge carriers into the conduction band of the semiconductor material at those temperatures. Thus, current flow is readily directed to the contacts 128. Hence, it is unnecessary to make a low-resistance room-temperature electrical contact with the layer 170.

For convenience, we sometimes refer to layer 170 as the field shield since it prevent or greatly reduces the portion of the applied electric field during the electrostatic bonding step that is felt by the active electronic devices of circuit 150. However, layer 170 does not actually shield the electronic devices from sensing any of the applied electric field, but rather it, in conjunction with contacts 128, serves to provide a control means by which the applied field can be re-distributed across the insulating layer 180 after having been safely conducted around the sensitive regions of the electronic devices by the substantially vertical current paths through contacts 128, indicated by dotted lines 183 in FIG. 8. For that reason, it is technically more accurate to refer to layer 170 as the field control layer.

The electric field control layer 170 can be advantageously utilized in circuits similar to circuit 150 to provide a ground line or plane for transistors and/or other circuit elements if desired. Selected parts of devices and circuit elements could be connected by interconnects passing through vias in layer 160 to accomplish this (not shown). If used, this would help reduce certain parasitic capacitances of the individual device elements within circuit 150, and also would reduce the influence of stray charges induced by alpha particles.

Finally, as shown in FIG. 7, an insulating layer 180 is deposited over the field shield 170. The thickness of layer 180 may range from 0 to 2000 nm or more. In other words, the layer 180 need not even be used, but preferably is. A planarizing insulator, such as BPSG, is preferably used in order to smooth out the topology of the surface 182 of layer 180 and to provide any additional thickness desired to obtain the desired height 184 between surface 182 and surface 68 of the epi layer 44. The deposited layer 180 is also patterned so as to not fill in the cavity region under the beam 56. Although the surface 182 of layer 180 should ideally be uniformly smooth as shown in FIG. 7, those skilled in the art will appreciate that there will very likely be some unevenness to the surface, since true flatness is difficult to achieve. In other words, it will have a topology roughly corresponding to that of the underlying materials, as illustrated in FIG. 8.

As illustrated by FIG. 8, the top dielectric layer 180 is then electrostatically bonded to a glass substrate or wafer 190. The wafer 190 forms an insulating substrate for the integrated sensor, namely accelerometer 20. If surface 182 is not very flat, the layer 180 will not contact the surface 204 of glass substrate 190 in all locations, but instead will only contact it in selected locations, namely the high points, such as locations 192, 194 and 196, of layer 180. As previously mentioned, the most sensitive area of the silicon FETs 26 and 28 is the active channel regions 142 and 144 adjacent the gates. Since the gate regions thereabove have interconnect sections 136 and 140 disposed thereon, in addition to the polysilicon gates 86 and 88, the points 194 and 196 are assured of being among the high points of the planarizing layer 184. Thus, high points 194 and 196 will be firmly pressed against and bonded to the glass substrate 190, thereby helping to avoid mechanical stress and strain upon the active regions of the FETs 26 and 28. The high point 192 helps ensure that the anchored end portion 194 of the beam 36 is well-supported. We estimate that only 5 to 25 percent of the overall area of layer 180 need be bonded to the glass 190 in order to be suitably supported to avoid stress or strain that would adversely affect the quality of the single-crystal semiconductor material of epi layer 44, and thus the performance of circuit 150 or devices therein. Accordingly, distributed portions of layer 180, and indeed portions of the field control layer 170 thereabove, could be partially or completely etched away without seriously affecting the structural integrity of the completed sensor. Such etched away regions of the layer 180, such as region 197 indicated by a dotted line, might be used for providing clearance for patterned conductive leads on substrate 190 such as lead 199 indicated in phantom.

Insulating substrate 190, or similar plate glasses with a coefficient of thermal expansion very closely matched to that of silicon semiconductor material, is preferably high-temperature Corning Code 7740 or Code 1729 glass which is transparent and is preferred as the insulating substrate material so that a relatively standard IC process can be used after the electrostatic bonding step. The Code 1729 glass is recently-developed alkaline-earth aluminosilicate glass that has an anneal point of 853 degrees C., which suggests process temperatures may be limited to about 800 degrees C. to avoid other problems related to deformation of the glass substrate during processing. This temperature limit is sufficient to allow reasonable thermal oxidation rates for silicon and the activation of ion-implanted dopants, should such steps be employed subsequent to the bonding step. Also, Code 1729 glass is an excellent match for the thermal expansion coefficient of silicon, better than Code 7740 glass, which helps ensure that silicon Films bonded to it will not experience mechanical damage or stress due to high-temperature processing or during subsequent cooling to room temperature. Code 1729 glass is alkali-Free glass which further helps minimize sodium or other mobile ion contamination. An advantage of Code 1729 glass and of Code 7740 glass is that they are both available in plate glass form, which is very inexpensive compared to alternative insulating support substrates, such as oxidized crystalline silicon wafers.

Prior to the electrostatic bonding step, a patterned plate 34 is formed on the glass 190 to serve as the stationary plate of capacitor 32 of the accelerometer 20. Preferably, a composite structure is used to form plate 34 consisting of a first layer 200 of chrome and a second layer 202 of gold. The chrome layer is typically about 10 nanometers thick and is used to achieve reasonable adherence to glass surface 204 since gold is a noble metal and does not adhere to glass very well. The gold layer 202 is typically about 300 nanometers or more thick, but as will be readily appreciated, the thickness of these two layers is a design choice. The aforementioned thickness of the gold layer 202 is preferred when a thermocompression bond, which is subsequently discussed, is used to connect bond wires to the IC package header.

In preparation for the electrostatic bonding process, surface 204 of substrate 190 is conventionally polished and thoroughly cleaned, preferably by a plasma cleaning step as well as by other conventional cleaning steps. The top layer 180 of the FIG. 7 structure is then placed on the polished cleaned surface 204 of the glass wafer 32, and this unbonded composite structure is placed in a conventional electrostatic bonding apparatus 210. Apparatus 210 includes suitable electrodes 212 for electrically contacting the back surface 214 of the glass substrate 190 and the back surface 216 of the silicon wafer 40. It also includes an adjustable high-voltage DC power supply 218. The electrodes 212 may be made of stainless steel or a refractory metal such as molybdenum, tungsten or known alloys thereof. The wafer 40, including the circuit structure 150 thereon, the support substrate 190, and electrodes 212, are then heated to a temperature near but below the annealing point of the glass substrate 190, and a suitable DC potential, such as approximately 800 to 1200 volts or more, is applied for approximately thirty minutes. Under these conditions, an electrostatic bond is formed between the insulating layer 180 and the glass 190 that is irreversible and as strong as the silicon wafer itself. (If layer 180 is not used, conductive field control layer 170 may be electrostatically bonded directly to an insulating substrate 190.) Further details of the electrostatic bonding process need not be described since the insulator-glass electrostatic bonding process is well-known. See, e.g., U.S. Pat. No. 3,397,278 to D. I. Pomerantz; Y. Lee et al., "A Batch-Fabricated Silicon Capacitive Pressure Transducer With Low-Temperature Sensitivity," *IEEE Trans. Electron Dev.*, 29, pp. 42–47 (Jan. 1982); J. Wallis el al., "Field-Assisted Glass-Metal Sealing," *Journal of Applied Physics*, 10, p. 3946 (Sep. 1969); R. Frye et al., "A Field-Assisted Bonded Process For Silicon Dielectric Isolation," *Journal of the Electrochemical Soc.*, Vol. 133, pp. 1673–1677 (Aug. 1986). It is worth noting that the vast majority of the total electric field applied by apparatus 210 will appear between the field control layer 170 and the lower electrode 212 at the backside 214 of glass substrate 190. By using one or more such contacts 128, it is not necessary in order to safely perform the electrostatic bonding step, to etch all the way through the crystalline wafer 40 in order to make contact with the field control layer 170. Our research suggests that the field control layer 170 need not be made as a continuous plane, although this is probably desirable in many instances. Instead, holes or openings could be provided in the field control layer as long as such holes or openings were positioned laterally away from the active regions of the semiconductor devices. Alternatively, a mesh-like field control layer 170 could also be employed is desired, as long as the individual openings in the mesh were not too large.

After the electrostatic bonding step is completed, the bulk portion 42 of the crystalline wafer is removed, typically by preferential silicon etching, which is a well-known semiconductor processing technique. When the bulk region 42 is doped n-type silicon semiconductor material, one suitable etchant is an 8:3:1 ratio of acetic, nitric and hydrofluoric acids which is a preferential silicon etchant that very slowly etches silicon which is lightly doped ($10^{18}$cm$^{-3}$ or less) while rapidly etching away the heavily-doped p-type silicon substrate. When the bulk region 42 of the wafer is lightly doped and a heavily-doped p-type boron buried layer is employed as an etch stop, as described in our two aforementioned co-pending U.S. patent applications, a conventional ethylenediamene/pyrocatechol/water etchant (EDP) may be used as the etchant. This etchant effectively stops on such a buried layer due to the difference in etching rates of greater than 500:1 between the lightly-doped silicon wafer and the buried etch stop layer. Other anisotropic etchant solutions which could also be used in place of the EDP solution for removing lightly-doped silicon material include a hydrazine solution or a potassium hydroxide solution.

After the bulk region 42 of the semiconductor wafer 40 is removed, the epitaxial layer 44 remains. This epitaxial film 44 is then thinned and prepared for Further processing using standard chemical-mechanical silicon polishing techniques. Such polishing removes the interfacial layer located at the etch stop between bulk region 42 and layer 44 and provides a high-quality or mirror-like surface suitable for the subsequent processing steps.

Figure 10:
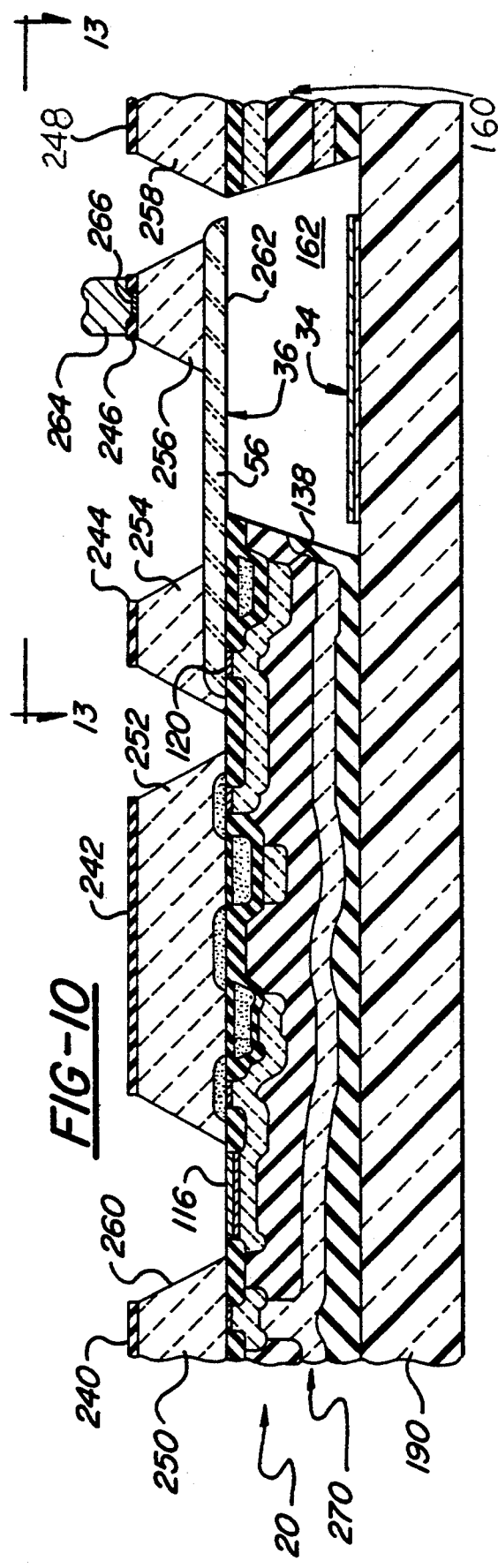

Depending on the type of doping of bulk region 42, either one of the foregoing etch stop techniques and polishing steps may be used to obtain a uniformly thin, single-crystal silicon semiconductor layer 44 having a desired thickness such as 1.5 to 5 microns or more. An oxide layer 234 is then thermally grown or deposited over the polished surface 232 of the epi layer 44 and may be approximately 50 to 500 nanometers thick. Next, a layer of conventional photoresist (not shown) is deposited, patterned and developed so as to remove the resist to allow the oxide layer 234 in areas where the underlying silicon 44 is to be removed in the next step, which is illustrated in FIG. 10. The unremoved portions 240, 242, 244, 246 and 248 of layer 234 define the areas where the underlying silicon portions 250-258 are to remain. The epitaxial layer 44 is preferably etched with an anisotropic etchant, such as EDP, where openings have been made in layer 234, thereby leaving silicon islands 250-258 under the patterned masking oxide portions 240-248. The islands 250-258 each have [111] planes as side walls, such as side wall 260, which are all at an angle of 54.7 degrees. This creates an SOI structure for the circuit 250, since the areas where the silicon is etched away provides dielectric isolation between electronic devices located in different mesas or islands. It is preferred to use an anisotropic etchant like EDP that removes silicon only in one direction and does not undercut or etch the deposited silicon oxide layer 234. The etching step also removes the lightly-doped silicon 44 above cavity 162, so that the heavily-doped region 56 now becomes freestanding beam 36 which can respond to changes in acceleration.

If desired, some additional mass can be provided on beam 36 by patterning the oxide layer 234 so as to leave the island 256 of single-crystal silicon material near the free end 26 of the beam 36 as shown in FIG. 10. Since silicon semiconductor material has a relatively low density, it may be necessary, in order to add yet further mass to provide, above the island 256, more material, such patterned metal 264. Gold may be used for this additional mass 264 if a suitable layer of patterned metal 266, which adheres well to silicon, such as chrome, is provided thereunder. Using an island 256 and, if needed, a patterned mass 264 of material is particularly useful in accelerometer applications where a controlled mass must be precisely located on a suspended beam, such as beam 36. This particular technique of placing mass on the end of a free beam is particularly accurate since the size, location, and thickness of island 256 and patterned mass 264 can be accurately controlled using conventional integrated circuit processing techniques.

The size, length, width and thickness of the beam 36, as well as the mass (if any) suspended thereon are dependent upon the specifications for the particular application in which the accelerometer 20 will be used, such as the desired range of sensitivity. As is well known, the resonant frequency of the beam should be outside of the frequency range of interest. A short, stub-like beam would be used to sense high levels of acceleration, where a long, narrow beam would be used to build a very sensitive accelerometer designed to sense fractions of one gravity. For example, the free length of the beam 36 may range from about 10 microns to several millimeters in length, with the width of the beam would change in accordance with the design specifications and the length. If the accelerometer 20 is to operate over a wide dynamic range, then the height 184 of the cavity 62 beneath the beam 56 would be greater, whereas if a very sensitive transducer is desired, the required dynamic range may not be as great and the height 184 of the cavity 162 need not be as great. Similar considerations apply when specifying the dimensions of the free area of a semi-flexible plate used in solid-state capacitive pressure transducers. These are all design trade-offs well known to those in the solid-state semiconductor accelerometer or pressure sensor arts. The design and specification of such semi-flexible members is well-understood by those skilled in the art and need not be further discussed here. Those interested in a detailed treatment of the requisite design calculations and considerations for such members are referred to a well-known treatise often used by those in the aforementioned field, namely S. Timoshenko & S. Woinowsky-Krieger, *Theory of Plates and Shells*, McGraw-Hill, New York, N.Y. (1959).

An important feature of the technology of the present invention is that the etching of silicon layer 44 shown in FIG. 10 exposes the regions of metal, such as pad 116, that will be used as the bonding pads for the circuit 150. Thus, the present invention has an important advantage in that it provides for a very simple method of obtaining planar bonding pads on an integrated sensor or circuit, such as sensor 20 and circuit 150, as part of providing patterned interconnects between devices in circuits 150. Our processing sequence renders it unnecessary to further expose the completed structure 20 shown in FIG. 10 to additional complicated processing steps in order to form bonding pads for making electrical contact with the circuit 150 or transducer 30.

FIG. 11 shows the completed accelerometer 20 in a perspective view which shows one easy way of making the necessary external connections to the bonding pads. The metal region 116 is shown between silicon islands 250 and 252 and extends laterally away from these islands to a large rectangular pad area 270. A similar large rectangular pad area 272 is shown connected to trace 274 extending laterally outwardly from mesa 252. Traces 116 and 274 and rectangular bond pads 270 and 272 are all preferably simultaneously formed from the same layer of material when metal region 116 is formed. Rectangular extension 276 of the parallel plate 34 of capacitor 32 is also used as a bond pad.

External connections may be made using any conventional or suitable bonding technique, such as thermocompression wire bonding or ultrasonic wire bonding. For example, gold wires 280, 282 and 284 are shown in FIG. 11 respectively bonded to pads 270-276 using a thermocompression bonding, which results in the formation of a flattened bond ball, such as ball 288, on the pad. The wires 280-284 lead to a post on the lead frame of a conventional or suitable IC package.

FIG. 12 shows the circuit 150 and transducer 30 of the completed sensor 20 in schematic diagram form. The bonding connections between pads 270, 272 and 276 to wires 280, 282 and 286 are designated for convenience by conventional connector symbols, even though the connections are permanent. Various interconnections between the transistors 26 and 28 have been labeled where practical to correspond to interconnects or other conductors identifiable in the structures of FIGS. 2-11.

The operation of circuit diagram 22 of FIG. 12 is well understood by those in the art, and hence will only be briefly described. Electrical power is delivered over conductors 280 and 286 which respectively are nominally at a solid-state circuit supply voltage VDD (such as +5 volts DC) and ground potential GND (0.0 volts). The amount of force, namely acceleration, detected by the transducer 30 will be approximately proportional to the deflection of the free portion of beam 36. As the beam 36 moves closer to the plate 34, the capacitance $C_X$ of capacitor 32 formed by the beam 36 and plate 34 increases, and as it moves away, the capacitance decreases. The change in capacitance may be measured in a variety of ways. One acceptable technique is disclosed in commonly assigned, co-pending U.S. patent application Ser. No. 057,884, filed Jun. 1, 1987, in the names of K. D. Wise and H-L Chau, and is entitled "Ultraminiature Pressure Sensor and Method of Making Same," the disclosure of which is hereby incorporated by reference. As disclosed therein, a source of approximately constant current is passed through a switchable transistor which charges up an adjustable capacitor of a pressure sensor, but which could easily be a capacitor associated with an accelerometer. The time required to charge the capacitor to a certain predetermined threshold level provides a reasonably accurate indication of the value of the capacitance at that brief interval of time. The rate at which the capacitor 32 will charge depends upon the value of its capacitance $C_X$ and the resistance of transistor 28, which acts as a pull-up resistor, assuming transistor 28 is made considerably smaller than transistor 26 which it easily can be. Transistor 26 is turned on by appropriately biasing gate terminal 290 high, so as to render FET fully conducting. The voltage at terminal VOUT at wire 282 is then proportional to the increasing voltage across capacitor 32. Thus, the charging rate of capacitor 32 can be determined. The gate terminal 290 could be driven, if desired, by other circuitry (not shown) which could be fabricated as part of the sensor 20.

As will be appreciated by those skilled in the art, considerably more complex circuits may be fabricated. The simple circuit 24 and the transducer 30 were selected for ease of illustrating simply but fully the structural details, advantages, features and novel processing steps of the present invention. Those skilled in the art will readily appreciate that much more sophisticated and accurate integrated circuits may be employed in the circuit structure of an integrated sensor made in accordance with the present invention. For example, the more sophisticated circuitry disclosed in aforementioned co-pending U.S. patent application Ser. No. 057,884 may be readily implemented using conventional LSI or VLSI circuit designs and Fabrication technology. Alternatively, any conventional circuitry used in prior art solid-state accelerometers may be used.

FIG. 13 is presented to illustrate, in conjunction with FIG. 10, another fully integrated sensor of the present invention, namely a capacitive pressure sensor. The circuit portion of this sensor may be made identical to the completed circuit 150 illustrated in FIG. 10. Thus, the structure 300 shown in FIG. 13 represents only the pressure transducer portion of the integrated sensor corresponding to the section taken along lines 13—13 indicated in FIG. 10. Instead of the heavily-doped p++ single-crystal region 56 being a beam, it is enlarged in width and length to form a semi- flexible plate 36' for the pressure transducer. The rim structure 304 encircles the periphery of the free portion 302 of plate 36'. In the construction shown in FIG. 13, the cavity 308 under plate 302 may be hermetically sealed by having an extension 310 of the stationary plate 34 pass underneath the planarizing layer at location 312 to an exposed rectangular bond pad section such as section 276 shown in FIG. 11. Circuit 150 of the accelerometer shown in FIG. 10 could clearly also be employed with the transducer section 300, resulting in a fully-integrated sensor. Any conventional or suitable technique for forming such a hermetic seal known to those in the art may be used. For further information on the electrostatic bonding and hermetic sealing of a pressure sensor rim structure to a glass substrate, see aforementioned U.S. patent application Ser. No. 057,884, and Y. S. Lee and K. D. Wise, "A Batch-Fabricated Silicon Capacitive Transducer With Low Temperature Sensitivity," *IEEE Transactions on Electron Devices,* Vol ED-29, No. 1, pp. 42–48 (Jan. 1982).

As the capacitive pressure sensor illustrated in FIG. 13 suggests, the novel structures and processes of the present invention may be utilized to fabricate many different types of sensors having different transducer elements. Foreseeable applications of the present invention include accelerometers of the piezo-resistive type as well as the capacitive type, pressure sensors of the piezo-resistive type and capacitive type, microflow sensors and temperature sensors, among others. Since such transducers can be arranged in array fashion, two-dimensional sensing of a parameter is also feasible, which means that infrared imagers can also be constructed. All of these microsensors can be manufactured using the novel bonding structure and fabrication techniques of the present invention so as to incorporate silicon electronic circuitry directly on-chip with the transducer elements. Moreover, bonding pads for lead attachment and connection to the resulting integrated structure may also provided in integral form with the circuitry and transducers. Other foreseeable applications include chemical sensors such as ion-sensitive field-effect transistors (ISFETs) and gas sensors, such as oxygen sensors.

The technology of the present invention combines conventional VLSI silicon circuit fabrication, a unique composite bonding structure including field control means, electrostatic bonding, and preferential silicon etching. Although fabrication processes for n-channel MOSFETs have been presented herein, any other conventional or suitable VLSI technology compatible with silicon wafers may be used to form integrated circuitry. Thus, horizontally and vertically arranged diodes, p-channel MOSFETs, CMOS and JFET devices, and npn and pnp BJTs and most other transistor structures, as well as numerous sensor and visual display structures, can be used with the present invention and are visualized as variations or extensions of the structures and/or devices disclosed herein. The present invention allows these technologies to be mixed and matched with transducers so as to produce an almost infinite number of combinations of circuits and transducers, which removes significant design restrictions and allows unprecedented flexibility in the fabrication of dielectrically isolated sensors and circuits on insulating substrates. Thus, the present invention permits the design of a specific microelectronic circuit or sensor to be highly optimized for the intended application.

The technology of the present invention also may be used in applications where optically transparent glass substrates are desirable and high-performance transistors are required, such as active-matrix liquid crystal displays. The novel method of the present invention for forming SOI circuit structures may also be used to fabricate virtually any type of microelectronic circuitry-using devices which require charge storage. Since SOI electronic devices have extremely low leakage currents, charge storage device examples include dynamic MOS circuitry such as DRAM or imaging devices such CCD.

It should be appreciated that the foregoing processes, SOI structures and embodiments are well-suited to achieve the objects above stated. It is recognized that those skilled in the art may make various modifications or additions to the preferred embodiments chosen to illustrate the invention without departing from the spirit and scope of the present contribution to the art. For example, the thickness and size of the insulating layers and conductive layers as well as the single-crystal layers and/or the various doped regions or portions therein shown in the first and second embodiments can be varied to suit the particular circuits and sensors being fabricated. As is well-known, devices for high-voltage applications will typically require significantly thicker layers to support the applied voltages. Similarly, the doping levels of the various layers and substrates may be varied as required or desired to suit size and needs of the particular circuitry devices or transducer being Fabricated. Moreover, the voltages used to accomplish the electrostatic bonding may vary greatly, from about tens of volts D.C. up to about 2000 volts D.C. or more, depending upon bonding temperatures, times, and thicknesses and relative conductivities of the various substrates, films and layers. Also, a thermally oxidized silicon wafer could be used in place of a glass substrate 190. Also, a conductive crystalline wafer could be used. This would have the advantage of allowing higher temperature processing steps to be performed subsequent to the electrostatic bonding step, but would have the disadvantage of not providing an optically transparent substrate, which is required for a number of applications. It is also possible to incorporate or make part of a transducer of a sensor in the support substrate if desired. Finally, it should be recognized that multiple electrically interconnected and dielectrically isolated electronic devices and entire circuits may be simultaneously Formed using the SOI structures and processes described herein from a large area single-crystal silicon film 44 bonded in the foregoing manner to any type of support substrate, whether it be a conductive substrate, an insulating substrate, or a conductive substrate with an insulating film or layer deposited on one side thereof. Accordingly, it is to be understood that the present invention is not limited to the specific embodiments chosen to illustrate the invention, but should be deemed to extend to the subject matter defined by the appended claims, including all fair equivalents thereof.

We claim:

1. A microelectronic structure having a plurality of electronic devices, comprising:
   a solid-state circuit structure having at least two distinct electronic devices electrically interconnected to one another, each of the devices having at least one active region of single-crystal semiconductor material formed from a common layer of unrecrystallized bulk, epitaxially grown single-crystal semiconductor material;
   a support substrate; and
   insulating means disposed permanently and rigidly between the circuit structure and the support substrate, the insulating means being permanently joined to the circuit structure and electrostatically bonded to the support substrate, and including therein means for enabling the insulating means while permanently joined to the circuit structure to be electrostatically bonded to the support substrate without subjecting the active regions of the devices to a damaging electric field.

2. A structure as in claim 1, wherein:
   the insulating means for enabling includes first and second layers of insulating material and a first layer of conductive material located between the first and second layers of insulating material, with the first layer of insulating material being disposed between the circuit structure and the first layer of conductive material, and the second layer of insulating material being disposed between the first layer of conductive material and the support substrate; and
   the first layer of insulating material includes at least one opening therein for enabling direct electrical contact to be made to the first layer of conductive material so that an electric field can be applied across at least the second layer of insulating material during the bonding step.

3. A microelectronic structure as in claim 2, wherein:
   the support substrate is formed at least primarily of glass;
   the electronic devices are field effect transistors each having a source and drain, and the active region of each transistor is a channel region between its source and drain;
   the first layer of conductive material is selected from the group consisting of high-temperature refractory material, semiconductor material, and a combination of more than one thereof;
   the first and second layers of insulating materials include at least a portion thereof made of insulating material selected from the group consisting of silicon oxide, silicon nitride, siliconoxynitride and silicate glass.

4. A microelectronic structure as in claim 1 wherein:
   the first layer of insulating material has a thickness equal to at least several tens of nanometers, thereby reducing the parasitic capacitance between the first layer of conductive material and the electronic devices; and
   the electronic devices are silicon-on-insulator devices formed at least in part in distinct mesas of single-crystal silicon semiconductor material which mesas were initially part of the common layer of epitaxially grown single-crystal semiconductor material, whereby some of the devices are dielectrically isolated from one another, and electrically joined only through intended conduction paths.

5. An integrated solid-state sensor, comprising:
   a solid-state transducer structure having at least one electronically detectable characteristic which varies in response to variations in a physical condition present in the local environment of the transducer, the transducer structure being made at least in part from a first layer of unrecrystallized single-crystal semiconductor material formed from a bulk silicon wafer;
   a solid-state electronic device having (1) at least one active region thereof formed at least in part of the first layer of single-crystal semiconductor material, (2) means for electrically interconnecting the device to the to the transducer structure, and (3) means for producing an electrical signal which varies in response to the electronically detectable characteristic of the transducer structure;
   a support substrate; and
   insulating means permanently and rigidly joined between the electronic device and the support substrate, the insulating means being electrostatically bonded to the support substrate, and including therein means for enabling the insulating means while permanently joined to the electronic device to be electrostatically bonded to the support substrate without subjecting the active region of the device to a damaging electric field.

6. A sensor as in claim 5, wherein:

the first layer of single-crystal semiconductor material is part of a common layer of epitaxially grown single-crystal semiconductor material; and the insulating means for enabling includes first and second layers of insulating material and a first layer of conductive material located between the first and second layers of insulating material, with the first layer of insulating material being disposed between the electronic device and the first layer of conductive material, and the second layer of insulating material being disposed between the first layer of conductive material and the support substrate, and the first layer of insulating material includes at least one opening therein through which direct electrical contact is made between the common layer of epitaxially grown single-crystal semiconductor material and the first layer of conductive material, whereby an electric field applied during the electrostatic bonding step is diverted from the active region of the electronic device and applied primarily across the second layer of insulating material and support substrate.

7. A sensor as in claim 6, wherein:

the support substrate is formed at least primarily of glass;

the electronic device is a field effect transistor each having a source and drain, and the active region of each transistor is a channel region between its source and drain;

a first layer of conductive material is selected from the group consisting of high temperature refractory material, semiconductor material, and a combination of more than one thereof;

the first layer of insulating material includes material selected from the group consisting of silicon oxide, silicon nitride, siliconoxynitride and silicate glass; and the second layer of insulating material includes material selected from the group consisting of silicon oxide, silicon nitride, siliconoxynitride and silicate glass.

8. A sensor as in claim 6, wherein the transducer is selected from the group of transducers consisting of capacitive acccelerometers and capacitive pressure sensors, the support substrate is made at least primarily of glass, and the semiconductor material includes silicon as one of its primary constituents, and the transducer further comprises:

a solid-state electronic circuit structure for processing the signal from the transducer and including the first device and at least a second electronic device electrically connected to the first device, the second device including at least one active region thereof formed at least in part of the first layer of single-crystal semiconductor material; and bond pad means for enabling external electrical connections to be readily made to the sensor, the bond pad means including at least one substantially planar layer of highly conductive material disposed above the surface of the insulating means opposite from the support substrate at approximately the same distance from the support substrate as the active regions of first and second devices.

* * * * *